(12) United States Patent
Chen et al.

(10) Patent No.: US 11,419,207 B2
(45) Date of Patent: Aug. 16, 2022

(54) EMBEDDING REINFORCED CIRCUIT BOARD, CAMERA MODULE AND ELECTRONIC DEVICE

(71) Applicant: GUANGZHOU LUXVISIONS INNOVATION TECHNOLOGY LIMITED, Guangzhou (CN)

(72) Inventors: Bo Chen, Guangzhou (CN); HaiChao Du, Guangzhou (CN)

(73) Assignee: GUANGZHOU LUXVISIONS INNOVATION TECHNOLOGY LIMITED, Guangzhou (CN)

( * ) Notice: Subject to any disclaimer, the term of this patent is extended or adjusted under 35 U.S.C. 154(b) by 21 days.

(21) Appl. No.: 17/113,112

(22) Filed: Dec. 7, 2020

(65) Prior Publication Data

US 2021/0176856 A1 Jun. 10, 2021

(30) Foreign Application Priority Data

Dec. 10, 2019 (CN) .......................... 201922200664.3

(51) Int. Cl.
*H04N 5/225* (2006.01)
*H05K 1/02* (2006.01)

(52) U.S. Cl.
CPC ......... *H05K 1/0271* (2013.01); *H04N 5/2253* (2013.01); *H04N 5/2254* (2013.01); *H05K 2201/10121* (2013.01)

(58) Field of Classification Search
CPC .. H04N 5/2251; H04N 5/2252; H04N 5/2253; H04N 5/2254; H04N 5/2257; H04N 5/2258; H05K 1/0271
USPC .......................................................... 348/374
See application file for complete search history.

(56) References Cited

U.S. PATENT DOCUMENTS

2021/0306530 A1* 9/2021 Wang ................... H04N 5/2253

FOREIGN PATENT DOCUMENTS

| CN | 104954634 A | * | 9/2015 | ............. G03B 17/55 |
| CN | 112714239 A | * | 4/2021 | ............. G06F 21/31 |
| WO | WO-2019182307 A1 | * | 9/2019 | ........... G02B 27/646 |

* cited by examiner

*Primary Examiner* — Anthony J Daniels

(57) ABSTRACT

The present disclosure provides an embedding reinforced circuit board, a camera module, and an electronic device. The embedding reinforced circuit board, comprising a circuit board and a reinforcing plate. The circuit board comprises a first surface and a second surface opposite to the first surface. The first surface is provided with a component installation area. The second surface is provided with an accommodating groove. The width of at least one side of the cross-sectional area of the accommodating groove is wider than the width of the corresponding side of the component installation area. The cross-sectional area of the accommodating groove is parallel to the first surface or the second surface. The reinforcing plate is disposed in the accommodating groove.

13 Claims, 5 Drawing Sheets

EMBEDDING REINFORCED CIRCUIT BOARD, CAMERA MODULE AND ELECTRONIC DEVICE

CROSS-REFERENCE TO RELATED APPLICATION

This application claims the priority benefit of Chinese Patent Application Serial Number 201922200664.3, filed on Dec. 10, 2019, the full disclosure of which is incorporated herein by reference.

BACKGROUND

Technical Field

The present disclosure relates to the technical field of circuit board, particularly to an embedding reinforced circuit board, a camera module, and an electronic device.

Related Art

Riding on the trend of miniaturization of current electronic devices, size and volume of which needs to be reduced and hence the inner space surely becomes very limited. Thus, the circuit board inside the electronic device needs to be thinned for more space for components installation. However, the strength of thinned circuit board is insufficient and easy to break.

SUMMARY

The embodiments of the present disclosure provide an embedding reinforced circuit board, a camera module, and an electronic device tended to solve the problem of insufficient strength and easy to break of thinned circuit board due to reduction in size of electronic devices.

On the first aspect, the present disclosure provides an embedding reinforced circuit board, comprising a circuit board and a reinforcing plate. The circuit board comprises a first surface and a second surface opposite to the first surface. The first surface is provided with a component installation area. The second surface is provided with an accommodating groove. The width of at least one side of the cross-sectional area of the accommodating groove is wider than the width of the corresponding side of the component installation area. The cross-sectional area of the accommodating groove is parallel to the first surface or the second surface. The reinforcing plate is disposed in the accommodating groove.

On the second aspect, the present disclosure provides a camera module, comprising an embedding reinforced circuit board according to the first aspect, a light sensing component, and a lens component. The light sensing component is disposed on the circuit board and in the component installation area. The lens component is disposed on the first surface of the circuit board and in the component installation area. The lens component is disposed on one side of the light sensing component away from the reinforcing plate.

On the third aspect, the present disclosure provides an electronic device, comprising an embedding reinforced circuit board according to the first aspect and a component disposed on the first surface of the circuit board and in the component accommodating area.

In the embodiments of the present disclosure, by providing an accommodating groove corresponding to the component installation area on the circuit board and by providing a reinforcing plate with greater hardness than the circuit board in the accommodating groove, the hardness of the circuit board can be increased to support the components installed in the component installation area without increasing the thickness of the circuit board. In this way, the circuit board can be prevented from being damaged when subjected to external forces.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . ." does not exclude other same elements existing in the process, the method, the article, or the device which includes the element.

Figure 1:
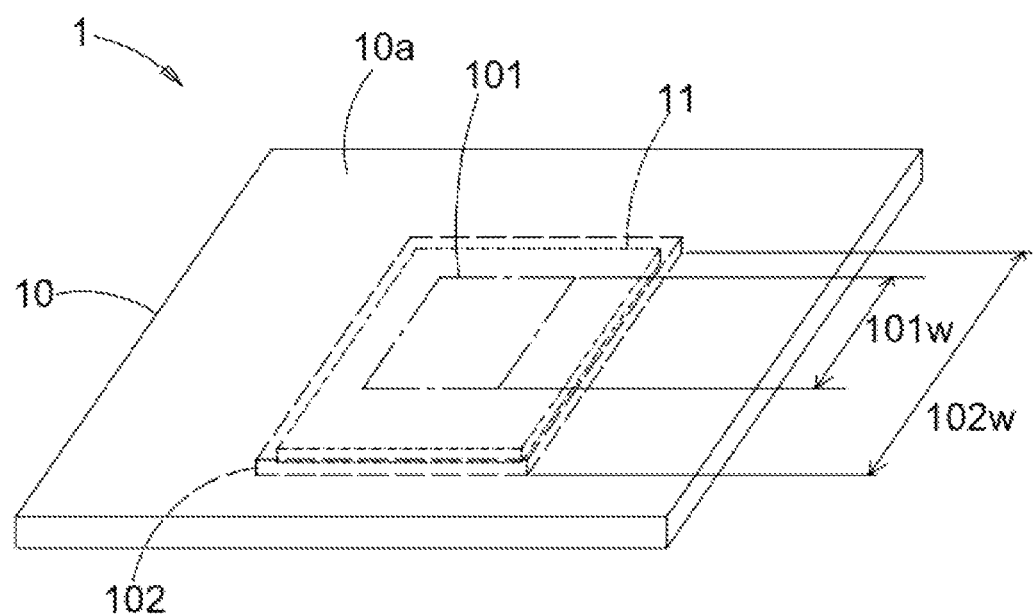
FIG. 1 is a perspective view of an embedding reinforced circuit board of the first embodiment of the present disclosure.
Figure 2:
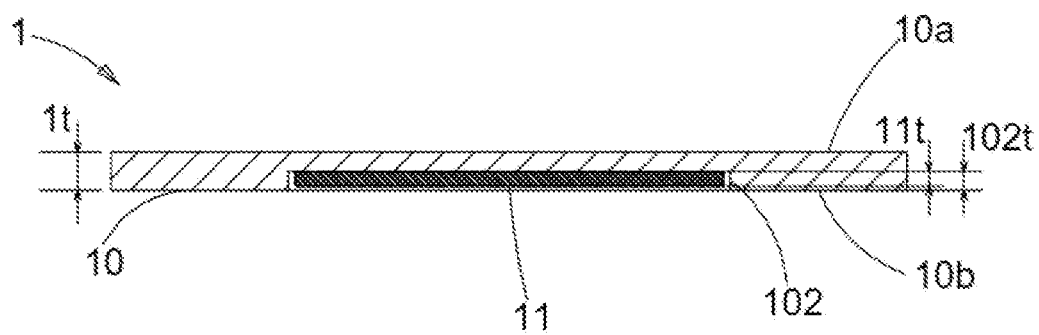
FIG. 2 is a cross-sectional view of the embedding reinforced circuit board of the first embodiment of the present disclosure.

FIG. 1 and FIG. 2 are perspective view and cross-sectional view of an embedding reinforced circuit board of the first embodiment of the present disclosure. As shown in the figures, the embedding reinforced circuit board 1 of this embodiment comprises a circuit board 10 and a reinforcing plate 11. The circuit board 10 comprises a first surface 10a and a second surface 10b opposite to the first surface 10a. A component can be installed on the first surface 10a. The first surface 10a is provided with a component installation area 101. The second surface 102 is provided with an accommodating groove 102, which is opposite to the component installation area 101. The width 102w of at least one side of the cross-sectional area of the accommodating groove 102 parallel to the first surface 10a or the second surface 10b is wider than the width 101w of the corresponding side of the component installation area 101. In this embodiment, the cross-sectional area of the accommodating groove 102 parallel to the first surface 10a or the second surface 10b is greater than the cross-sectional area of the component installation area 101 parallel to the first surface 10a or the second surface 10b. The reinforcing plate 11 is disposed in the accommodating groove 102. The thickness 11t of the cross section of the reinforcing plate 11 perpendicular to the first surface 10a or the second surface 10b is less than or equal to the depth 102t of the cross section of the accommodating groove 102 perpendicular to the first surface 10a or the second surface 10b. The cross-sectional area of the reinforcing plate 11 parallel to the first surface 10a or the second surface 10 is greater than the cross-sectional area of the component installation area 101 parallel to the first surface 10a or the second surface 10b. The hardness of the reinforcing plate 11 is greater than the hardness of the circuit board 10 to increase the strength of the circuit board 10 in the component installation area 101 without increasing the thickness 1t of the embedding reinforced circuit board 1 to prevent the circuit board 10 from being damaged when the components in the component installation area 101 exert a force on the circuit board 10. The reinforcing plate 11 could be made of metal, metal alloy, or plastic. In this embodiment, the reinforcing plate 11 is a steel sheet.

The reinforcing plate 11 is connected to the circuit board 10 through structural configuration, pasting, welding, or inject-molding. In some embodiments, the reinforcing plate 11 is connected to the circuit board 10 through structural configuration. For example, the reinforcing plate 11 comprises a fixing column, and the accommodating groove 102 of the circuit board 10 is provided with a fixing hole. The fixing column of the reinforcing plate 11 is inserted into the fixing hole of the circuit board 10 to fix the reinforcing plate 11 in the accommodating slot 102 of the circuit board 10. In some embodiments, the reinforcing plate 11 is connected to the circuit board 10 by pasting. For example, a surface of the accommodating groove 102 of the circuit board 10 could be coated with adhesive gel, and the reinforcing plate 11 is disposed on the adhesive gel to be attached to the accommodating groove 102 of the circuit board 10. In some embodiments, the reinforcing plate 11 is connected to the circuit board 10 by welding. For example, a surface of the accommodating groove 102 of the circuit board 10 is provided with a metal welding pad, and the reinforcing plate 11 is disposed in the accommodating groove 102 and is welded onto the metal welding pad to fix the reinforcing plate 11 in the accommodating groove 102. In some embodiments, the reinforcing plate 11 is connected to the circuit board 10 by inject molding. That is, the reinforcing plate 11 integrates with the circuit board 10 by joining the process of the injection molding procedure of the circuit board 10.

Figure 3:
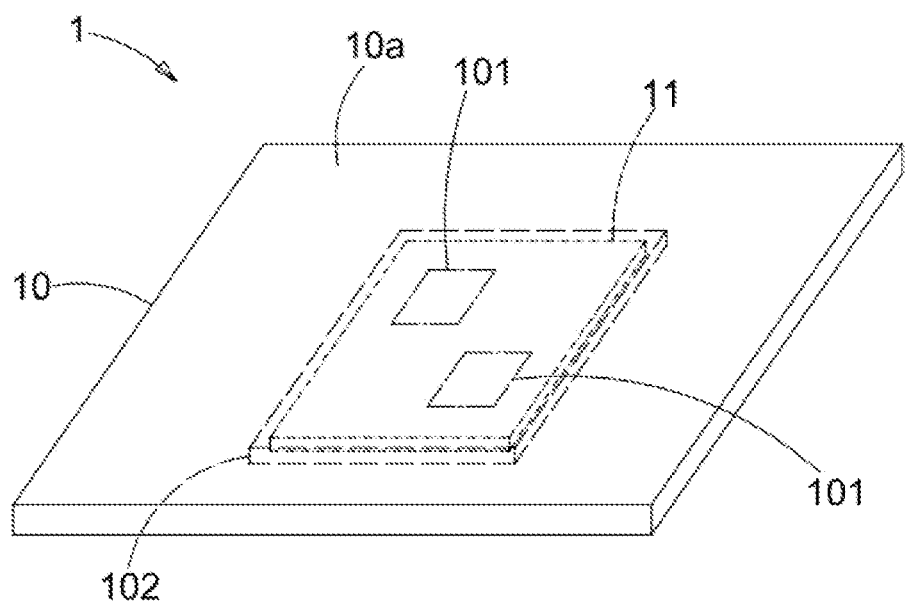
FIG. 3 is a perspective view of an embedding reinforced circuit board of the second embodiment of the present disclosure.

FIG. 3 is a perspective view of an embedding reinforced circuit board of the second embodiment of the present disclosure. As shown in the figure, the embedding reinforced circuit board 1 of this embodiment is different from that of the first embodiment in that the number of component installation areas 101 is multiple, and the plurality of component installation areas 101 correspond to the accommodating groove 102. In other words, the plurality of component installation areas 101 are disposed in a cross-sectional area of the accommodating groove 102 parallel to the second surface 10b. When components are disposed in each of the component installation areas 101, one reinforcing plate 11 can support a plurality of component installation areas 101.

Figure 4:
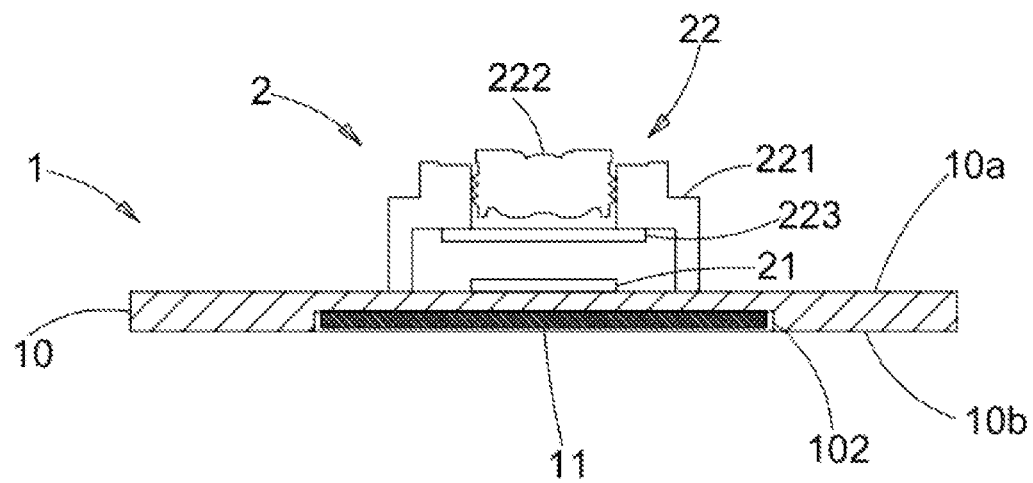
FIG. 4 is a cross-sectional view of a camera module of the third embodiment of the present disclosure.

FIG. 4 is a cross-sectional view of a camera module of the third embodiment of the present disclosure. As shown in the figure, the embedding reinforced circuit board 1 of the first embodiment is used in the camera module 2 of this embodiment. In addition to the embedding reinforced circuit board 1, the camera module 2 further comprises a light sensing component 21 and a lens component 22. The light sensing component 21 is disposed on the first surface 10a of the circuit board 10 of the embedding reinforced circuit board 1 and is disposed in the component installation area (see FIG. 1). The lens component 22 is disposed on the first surface 10a of the circuit board 10 of the embedding reinforced circuit board 1, and is disposed in the component installation area, and is disposed on the light sensing component 21.

In this embodiment, the lens component 22 comprises a lens holder 221 and a lens 222 actively connected to the lens holder 221. The lens holder 221 is disposed on the first surface 10a of the circuit board 10 of the embedding reinforced circuit board 1 and is disposed in the component installation area 101. The lens 222 is disposed on one side (the upper side referring to the figure) of the light sensing component 21 away from the reinforcing plate 11. The lens component 22 further comprises a filter 223. The filter 223 is disposed in the lens holder 221 and is disposed between the lens 222 and the light sensing component 21.

When the camera module 2 is in use, the lens 222 can move relative to the lens holder 221, so that the lens component 22 would generate a force on the embedding reinforcing circuit board 1. The lens component 22 is correspondingly provided with a reinforcing plate 11, which can increase the strength of the circuit board 10 connected to the lens component 22 and can prevent the embedding reinforced circuit board 1 from being damaged by force. The lens component 22 is a relatively precise and stress-sensitive component, so the accuracy of the movement between the lens 222 and the lens holder 221 and the accuracy of the alignment between the lens 222 and the light sensing component 21 needs to be in a high standard. When the circuit board 10 is deformed due to any stress or force, the operation of the lens component 22 could be affected even there is just a slight deformation, the quality of the camera image could be still affected. This deformation of the circuit board 10 can be reduced through the reinforcing plate 11. In other embodiments, the embedding reinforced circuit board 1 can be applied to various stress-sensitive components in addition to the lens component 22.

Figure 5:
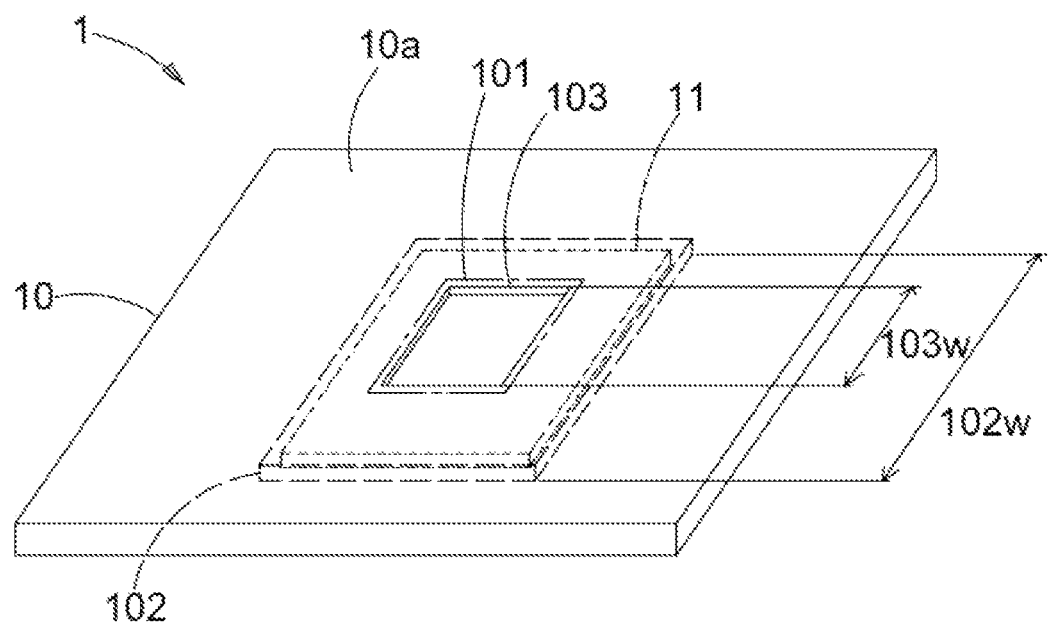
FIG. 5 is a perspective view of an embedding reinforced circuit board of the fourth embodiment of the present disclosure.
Figure 6:
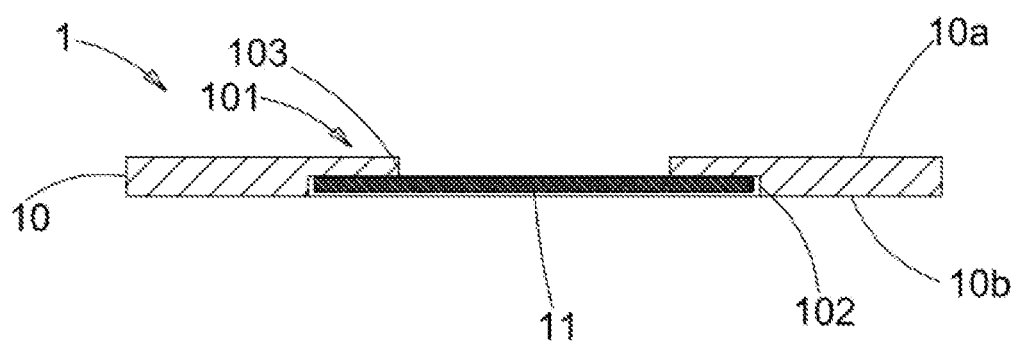
FIG. 6 is a cross-sectional view of the embedding reinforced circuit board of the fourth embodiment of the present disclosure.

FIG. 5 and FIG. 6 are perspective view and cross-sectional view of an embedding reinforced circuit board of the fourth embodiment of the present disclosure. As shown in the figures, the embedding reinforced circuit board 1 of this embodiment is different from that of the first embodiment in that the first surface 10a of the circuit board 1 is provided with a component accommodating groove 103, which is disposed in a component installation area 101. The width 102w of at least one side of the cross-sectional area of the accommodating groove 102 parallel to the first surface 10a or the second surface 10b is wider than the width 103w of the corresponding side of the component installation area 103. In this embodiment, the cross-sectional area of the component accommodating groove 103 parallel to the first surface 10a or the second surface 10b is smaller or equal to the cross-sectional area of the component installation area 101 parallel to the first surface 10a or the second surface 10b, so the cross-sectional area of the component accommodating groove 103 parallel to the first surface 10a or the second surface 10b is smaller than the cross-sectional area of the accommodating groove 102 parallel to the first surface 10a or the second surface 10b. The component accommodating groove 103 accommodates components. In this way, the height of the component protruding from the first surface 10a of the embedding reinforced circuit board 1 can be reduced when the size of the component is kept unchanged. In this embodiment, the component accommodating groove 103 communicates with the accommodating groove 102. The component accommodating groove 103 may also not need to communicate with the accommodating groove 102, which should not be limited thereto.

Figure 7:
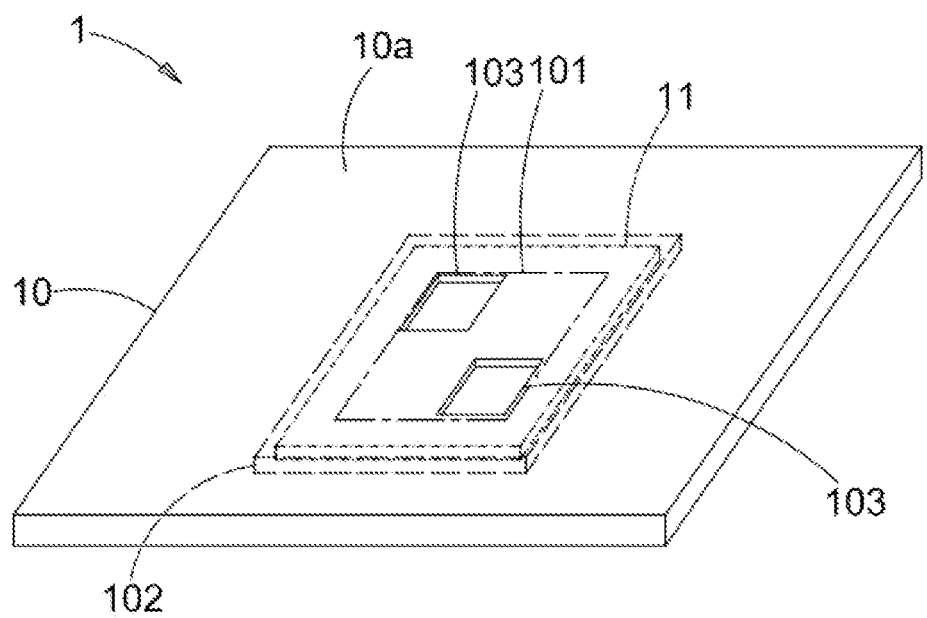
FIG. 7 is a perspective view of an embedding reinforced circuit board of the fifth embodiment of the present disclosure.

FIG. 7 is a perspective view of an embedding reinforced circuit board of the fifth embodiment of the present disclosure. As shown in the figure, the embedding reinforced circuit board 1 of this embodiment is different from that of the fourth embodiment in that it is provided with a plurality of component accommodating grooves 103 in one component installation area 101. Each of the component accommodating grooves 103 can accommodate components originally disposed on the first surface 10a of the circuit board 10.

Figure 8:
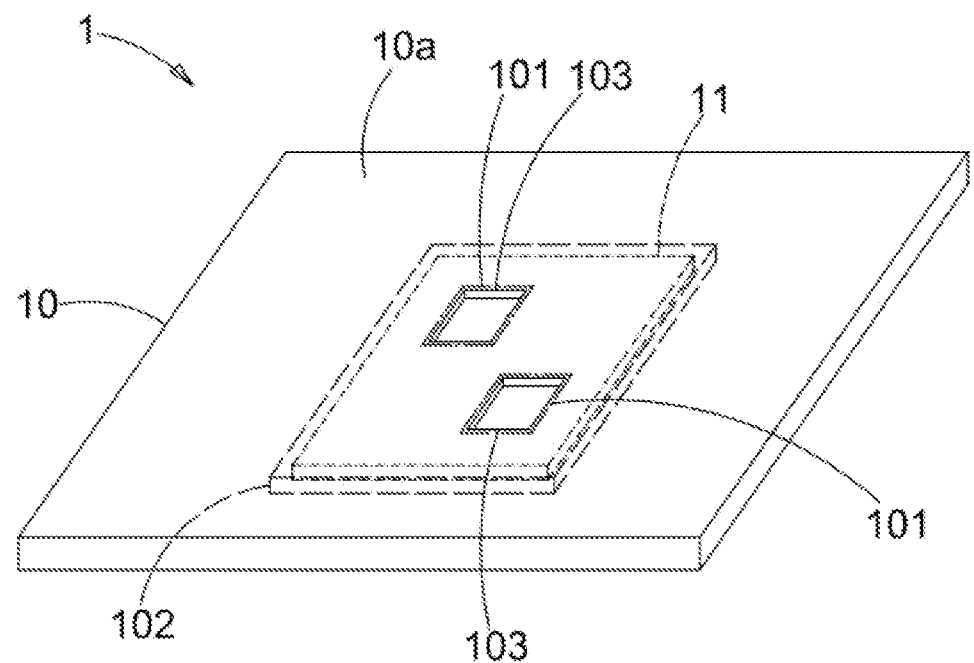
FIG. 8 is a perspective view of an embedding reinforced circuit board of the sixth embodiment of the present disclosure.

FIG. 8 is a perspective view of an embedding reinforced circuit board of the sixth embodiment of the present disclosure. As shown in the figure, the embedding reinforced circuit board 1 of this embodiment is different from that of the fourth embodiment in that the number of component installation areas 101 in this embodiment is multiple, and the plurality of component installation areas 101 correspond to the accommodating groove 102. In other words, the plurality of component installation areas 101 are disposed in a cross-sectional area parallel to the second surface 10b of the accommodating groove 102. A component accommodating groove 103 is disposed in each of the component installation area 101. When a component is disposed in the component accommodating groove 103 of each of the component installation area 101, one reinforcing plate 11 can support the components of the component accommodating groove 103 of the plurality of component installation areas 101. By disposing the components in the component accommodating groove, the height protruding from the first surface 10a of the embedding reinforced circuit board 1 can be reduced without changing the size of the components.

Figure 9:
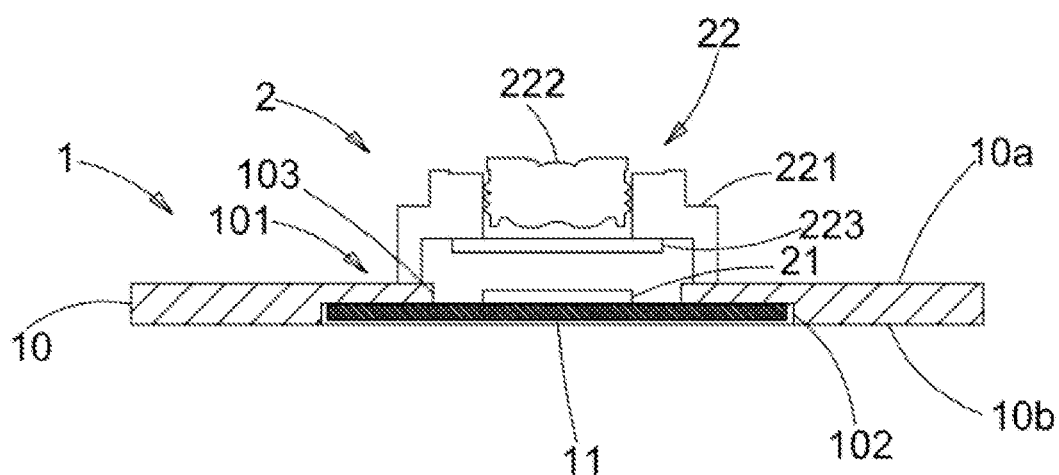
FIG. 9 is a cross-sectional view of a camera module of the seventh embodiment of the present disclosure.

FIG. 9 is a cross-sectional view of a camera module of the seventh embodiment of the present disclosure. As shown in the figure, the camera module 2 of this embodiment is different from that of the second embodiment in that the camera module 2 of this embodiment uses the embedding reinforced circuit board 1 of the fourth embodiment. The light sensing component 21 is disposed in the component accommodating groove 103. The lens component 22 is disposed on the first surface 10a of the circuit board 10 of the embedding reinforced circuit board 1, and is disposed in the component installation area 101 and on the light sensing component 21. Due to the light sensing component 21 is disposed in the component accommodating groove 103, the height of the lens component 22 can be reduced to lower the overall height of the camera module 2. When the camera module 2 of this embodiment is installed onto an electronic device, the camera module 2 uses the embedding reinforced circuit board 1 of the fourth embodiment, so the overall height of the camera module 2 can be reduced. Thus, the space occupied by the camera module 2 in the electronic device can be reduced, and the electronic device is able to accommodate other components, or the size of the electronic device can be reduced.

The present disclosure also provides an electronic device, which uses the embedding reinforced circuit board of the above embodiment. The first surface of the circuit board of the embedding reinforced circuit board can be provided with components, which are disposed in the component installation area. The electronic device can be a mobile phone, a tablet computer, a laptop, or other electronic devices In summary, embodiments of the present disclosure provide an embedding reinforced circuit board, a camera module, and an electronic device. By providing an accommodating groove corresponding to the component installation area on the circuit board and by providing a reinforcing plate with greater hardness than circuit board in the accommodating groove, the hardness of the circuit board can be increased to support the components installed in the component installation area without increasing the thickness of the circuit board. In this way, the circuit board can be prevented from being damaged when subjected to external forces. Besides, since a component accommodating groove is disposed in the component installation area of the circuit board, the components originally installed on the circuit board can be installed in the component accommodating groove. In this way, the overall height of the functional module formed by the embedding reinforced circuit board and the components can be reduced, allowing the functional module whose overall height comprises been reduced can be installed in an electronic device having a tighter inner space.

It is to be understood that the term "comprises", "comprising", or any other variants thereof, is intended to encompass a non-exclusive inclusion, such that a process, method, article, or device of a series of elements not only comprise those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. An embedding reinforced circuit board, comprising:
a circuit board comprising a first surface and a second surface opposite to the first surface, the first surface being provided with a component installation area, the second surface being provided with an accommodating groove, a width of at least one side of the cross-sectional area of the accommodating groove being wider than a width of a corresponding side of the component installation area, the cross-sectional area of the accommodating groove being parallel to the first surface or the second surface; and
a reinforcing plate disposed in the accommodating groove;
wherein the first surface is provided with a component accommodating groove disposed in the component installation area;
wherein the cross-sectional area of the component accommodating groove is smaller than or equal to the cross-sectional area of the component installation area; the cross-sectional area of the component accommodating groove and the cross-sectional area of the component installation area are parallel to the first surface or the second surface.

2. The embedding reinforced circuit board according to claim 1, wherein the component accommodating groove communicates with the accommodating groove.

3. The embedding reinforced circuit board according to claim 1, wherein a thickness of the reinforcing plate is smaller than or equal to the depth of the accommodating groove.

4. The embedding reinforced circuit board according to claim 1, wherein the hardness of the reinforcing plate is greater than the hardness of the circuit board.

5. The embedding reinforced circuit board according to claim 4, wherein the reinforcing plate is made of metal, metal alloy, or plastic.

6. A camera module, comprising:
an embedding reinforced circuit board according to claim 1;
a light sensing component disposed on the circuit board and in the component installation area; and
a lens component disposed on the first surface of the circuit board and in the component installation area, the lens component being disposed on one side of the light sensing component away from the reinforcing plate.

7. The camera module according to claim 6, wherein the first surface is provided with a component accommodating groove disposed in the component installation area; the light sensing component is disposed in the component accommodating groove.

8. An electronic device, comprising:
an embedding reinforced circuit board, comprising:
a circuit board comprising a first surface and a second surface opposite to the first surface, the first surface being provided with a component installation area, the second surface being provided with an accommodating groove, a width of at least one side of the cross-sectional area of the accommodating groove being wider than a width of a corresponding side of the component installation area, the cross-sectional area of the accommodating groove being parallel to the first surface or the second surface;
a reinforcing plate disposed in the accommodating groove; and
a component disposed on the first surface of the circuit board and in the component accommodating area;
wherein the first surface is provided with a component accommodating groove disposed in the component installation area.

9. The electronic device according to claim 8, wherein the cross-sectional area of the component accommodating groove is smaller than or equal to the cross-sectional area of the component installation area; the cross-sectional area of the component accommodating groove and the cross-sectional area of the component installation area are parallel to the first surface or the second surface.

10. The electronic device according to claim 8, wherein the component accommodating groove communicates with the accommodating groove.

11. The electronic device according to claim 8, wherein a thickness of the reinforcing plate is smaller than or equal to the depth of the accommodating groove.

12. The electronic device according to claim 8, wherein the hardness of the reinforcing plate is greater than the hardness of the circuit board.

13. The electronic device according to claim 12, wherein the reinforcing plate is made of metal, metal alloy or plastic.

* * * * *